(12) United States Patent
Jakobsson

(10) Patent No.: US 11,152,946 B2
(45) Date of Patent: *Oct. 19, 2021

(54) PHASE INTERPOLATOR AND INTERPOLATING METHOD

(71) Applicant: HUAWEI TECHNOLOGIES CO., LTD., Guangdong (CN)

(72) Inventor: Anders Jakobsson, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/795,314

(22) Filed: Feb. 19, 2020

(65) Prior Publication Data

US 2020/0259495 A1 Aug. 13, 2020

Related U.S. Application Data

(63) Continuation of application No. 16/442,076, filed on Jun. 14, 2019, now Pat. No. 10,608,646, which is a
(Continued)

(51) Int. Cl.
*H03L 7/08* (2006.01)
*H03L 7/081* (2006.01)
(Continued)

(52) U.S. Cl.
CPC ............ *H03L 7/0814* (2013.01); *H03K 5/13* (2013.01); *H03L 7/0998* (2013.01); *H03K 2005/00052* (2013.01)

(58) Field of Classification Search
CPC ... H03L 7/0812; H03L 7/0814; H03L 7/0891; H03L 7/18; H03L 7/0998; H03L 7/091;
(Continued)

(56) References Cited

U.S. PATENT DOCUMENTS 8,063,686 B1 * 11/2011 Naviasky ............... H04L 7/002
327/231
8,732,511 B2 5/2014 Sawarkar
(Continued)

FOREIGN PATENT DOCUMENTS

CN 101390288 A 3/2009
CN 103338037 A 10/2013
EP 2882131 A1 6/2015

OTHER PUBLICATIONS

Deka et al, "A 1Gbps—10 Gbps Multi-standard Auto-calibrated All Digital Phase Interpolator in 14nm CMOS," 2015 IEEE International Symposium on Circuits and Systems (ISCAS), Jul. 30, 2015, 4 pages.
(Continued)

*Primary Examiner* — Long Nguyen
(74) *Attorney, Agent, or Firm* — Fish & Richardson P.C.

(57) ABSTRACT

A phase interpolator to receive a first and a second input clock with a first and a second input clock edge comprises an interpolating circuit unit comprising: resistors in parallel; for each resistor, a connecting switch to connect and disconnect, as operated in accordance with one of the first and the second input clocks, the resistor to and from a first supply line; and a capacitor in series with the resistors. The phase interpolator allow controlling a partial group of the connecting switches to be operated in accordance with the first input clock, and controlling the rest of the connecting switches to be operated in accordance with the second input clock; and determine the output clock of the phase interpolator on the basis of an output signal of the interpolating circuit unit, defined by the voltage over the capacitor after the second input clock edge.

14 Claims, 6 Drawing Sheets

Related U.S. Application Data continuation of application No. PCT/EP2016/081419, filed on Dec. 16, 2016.

(51) Int. Cl.
   *H03K 5/13*   (2014.01)
   *H03L 7/099*  (2006.01)
   *H03K 5/00*   (2006.01)

(58) Field of Classification Search
   CPC ... H03K 5/13; H03K 5/26; H03K 2005/00052
   See application file for complete search history.

(56) References Cited

U.S. PATENT DOCUMENTS

| | | | |
|---|---|---|---|
| 9,584,304 B2 * | 2/2017 | Chien | H03L 7/0998 |
| 10,608,646 B2 * | 3/2020 | Jakobsson | H03L 7/0998 |
| 2007/0222530 A1 | 9/2007 | Rhee et al. | |
| 2008/0101521 A1 * | 5/2008 | Lee | H03L 7/0898 375/371 |
| 2019/0296748 A1 | 9/2019 | Jakobsson | |

OTHER PUBLICATIONS

Garlepp et al., "A Portable Digital DLL for High-Speed CMOS Interface Circuits,", IEEE Journal of Solid-State Circuits, vol. 34, No. 5, XP000908576, May 1999, 11 pages.

Hu et al, "A 10Gbps CDR based on Phase Interpolator for Source Synchronous Receiver in 65nm CMOS," 2012 IEEE International Symposium on Circuits and Systems, Aug. 20, 2012, 4 pages.

Jee et al, "A FIR-Embedded Phase Interpolator Based Noise Filtering for Wide-Bandwidth Fractional-N PLL," IEEE Journal of Solid-State Circuits, vol. 48, No. 11, Nov. 2013, 10 pages.

Nandwana et al, "A Calibration-Free Fractional-N Ring PLL Using Hybrid Phase/Current-Mode Phase Interpolation Method," IEEE Journal of Solid-State Circuits, vol. 50, No. 4, Apr. 2015, 14 pages.

Narayanan et al, "A Fractional-N Sub-Sampling PLL using a Pipelined Phase-Interpolator With an FoM of-250 dB," IEEE Journal of Solid-State Circuits, vol. 51, No. 7, Jul. 2016, 11 pages.

Nonis et al, "digPLL-Lite: A Low-Complexity, Low-Jitter Fractional-N Digital PLL Architecture," IEEE Journal of Solid-State Circuits, vol. 48, No. 12, Dec. 2013, 12 pages.

"PCT International Search Report and Written Opinion issued in International Application No. PCT/EP2016/061419 dated Mar. 24, 2017, 12 pages".

Office Action issued in Chinese Application No. 201680091643.9 dateed May 14, 2020, 16 pages (With English Translation).

Jang et al., "A 0.026mm2 5.3mW 32-to-2000MHz Digital Fractional-N Phase Locked-Loop Using a Phase-Interpolating Phase-to-Digital Converter," 2013 IEEE International Solid-State Circuits Conference, Feb. 2013, 3 pages.

Ries et al., "Combined matched filter /interpolator for digital receivers," 1996 8th European Signal Processing Conference (EUSIPCO 1996), Sep. 1996, 4 pages.

Office Action issued in Chinese Application No. 201680091643.9 dated Apr. 20, 2021, 17 pages (with English translation).

Solojazhinikov, "Radar," People's Posts and Telecommunications Press, Jun. 1958, 9 pages (with English abstract).

* cited by examiner

PHASE INTERPOLATOR AND INTERPOLATING METHOD

CROSS-REFERENCE TO RELATED APPLICATIONS

This application is a continuation of U.S. patent application Ser. No. 16/442,076, filed on Jun. 14, 2019, which is a continuation of International Application No. PCT/EP2016/081419, filed on Dec. 16, 2016. All of the afore-mentioned patent applications are hereby incorporated by reference in their entireties.

TECHNICAL FIELD

The present application relates to phase interpolators for receiving input clocks with different phases, and outputting an interpolated clock with an interpolated phase between those of the received input clocks, and to corresponding interpolating methods.

BACKGROUND

Phase interpolating is needed in various applications, such as in clock and data recovery (CDR). Phase interpolators are often included in various types of phase locking loops (PLL) which may be used, for example, in the radio front end, or in the radio transmitting stage, of a mobile terminal device.

Key factors determining the performance of a phase interpolator include low noise of the interpolated phase and good linearity of the interpolation operation carried out by the circuit(s) of the phase interpolator.

Phase interpolators, typically implemented as integrated circuits (IC), often comprise basic building blocks, or interpolating circuit units, carrying out the actual interpolating operation. Such circuit units may be combined and connected together to form stages, which in turn may be connected to form multi-stage interpolators.

Noise and linearity performance of a phase interpolator is strongly dependent on the performance of the interpolating circuit mitts) thereof. One of the most commonly used types of interpolating circuit units is that utilizing constant slope charging of a capacitor, providing good linearity of the interpolating operation. Basically, a constant slope interpolating circuit unit is based on charging a capacitor by current sources.

The performance of a phase interpolator being based on constant slope interpolating circuit unit(s), as well as that of phase interpolators of other types, may be greatly dependent on match between the components, such as current sources, used in the interpolating circuit unit(s).

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

It is an object of the application to provide phase interpolators with good linearity and noise performance, which phase interpolator may be implemented using relatively simple interpolating circuit units.

The foregoing and other objects are achieved by the features of the independent claims. Further implementation forms are apparent from the dependent claims, the description, and the figures.

According to a first aspect, a phase interpolator is provided which is configured to receive a first input clock having a first input clock edge with a first phase, and a second input clock having a second input clock edge with a second phase delayed from the first phase, and to produce an output clock having an output clock edge with an output phase between the first and the second phases The phase interpolator comprises an interpolating circuit unit, which in turn, comprises, between a first supply line for receiving a first DC potential and a second supply line for receiving a second DC potential differing from the first DC potential: a plurality of resistors in parallel; for each of the resistors, a connecting switch configured to connect and disconnect, as operated in accordance with one of the first and the second input clocks at a time, the resistor to and from the first supply line, respectively; and a capacitor in series with the plurality of the resistors.

The phase interpolator is configured to: allow controlling a partial group of the connecting switches to be operated in accordance with the first input clock, and controlling the rest of the connecting switches to be operated in accordance with the second input clock, the voltage over the capacitor after the second input clock edge then defining an output signal of the interpolating circuit unit; and determine the output clock on the basis of the output signal of the interpolating circuit unit.

In first implementation of the first aspect, to allow said way of controlling the connecting switches, the phase interpolator is configured to further receive a control signal; and the interpolating circuit unit comprises: a first clock line configured to receive the first input clock and a second clock line configured to receive the second input clocks; and for each connecting switch, a control link connected to the connecting switch and to a selection switch which is configured to connect, as operated in accordance with the control signal, the control link to one of the first and the second clock lines at a time to enable the connecting switch to be operated in accordance with the first or the second input clock, respectively.

In second implementation of the first aspect, which may be in accordance with the previous implementation, the interpolating circuit unit further comprises an inverter having an inverter input connected between the resistors and the capacitor to receive the voltage over the capacitor, the inverter being configured to determine the output signal of the interpolating circuit unit on the basis of the voltage over the capacitor after the second input clock edge.

In third implementation of the first aspect, which may be in accordance with any of the preceding implementations, the interpolating circuit unit further comprises a reset switch configured, when closed, to short circuit the capacitor.

In fourth implementation of the first aspect, which may be in accordance with any of the preceding implementations, the phase interpolator comprises two of the interpolating circuit units; the phase interpolator being configured to allow, in one interpolating circuit unit, controlling a partial group of the connecting switches to be operated in accordance with the first input clock, and controlling the rest of the connecting switches to be operated in accordance with the second input clock, and, in the other phase interpolating circuit, controlling all the connecting switches to be operated in accordance with one of the first and the second input clocks; the two interpolating circuit units forming a phase interpolating stage connected to a further phase interpolating stage to supply the output signals of the two interpolating circuit units as input clocks to the further phase interpolating stage.

In fifth implementation of the first aspect, which may be in accordance with any of the preceding implementations, the phase interpolator is implemented as a CMOS integrated circuit.

In a second aspect, a phase-locked loop (PLL) is provided, which comprises a phase interpolator in accordance with the first aspect or any of the implementations thereof. From use point of view, in the second aspect, the phase interpolator is thus used in a phase-locked loop.

In a first implementation of the second aspect, the phase-locked loop is an analog phase-locked loop.

In a second implementation of the second aspect, the phase-locked loop is a digital phase-locked loop.

In a third implementation of the second aspect, the phase-locked loop is a sub-sampling phase-locked loop.

In a third aspect, an interpolating method is provided for receiving a first input clock having a first input clock edge with a first phase, and a second input clock having a second input clock edge with a second phase delayed from the first phase; and producing an output clock having an output clock edge with an output phase between the first and the second phases.

The method comprises an interpolating operation, in turn comprising: charging or discharging a capacitor to or from a supply voltage through a plurality of resistors in parallel, by starting, as initiated by the first input clock edge, charging or discharging the capacitor through a partial group of resistors of the plurality of the resistors, followed, as initiated by the second input clock edge, by charging or discharging the capacitor through the entire plurality of the resistors; and determining an output signal of the interpolating operation on the basis of the voltage over the capacitor after the second input clock edge. The method further comprises determining the output clock on the basis of the output signal of the interpolating operation.

In a first implementation of the third aspect, the phase interpolating method further comprises receiving a control signal; and determining the partial group of the resistors on the basis of the control signal.

In a second implementation of the third aspect, which may be in accordance with the previous implementation, the determining the output signal of the interpolating operation includes generating an interpolated clock with an interpolated edge determined by the voltage over the capacitor after the second input clock edge passing a threshold level.

In a third implementation of the third aspect, which may be in accordance with any of the preceding implementations of the third aspect, the interpolating operation further comprises short circuiting the capacitor to allow initiation of a new interpolating operation.

In a fourth implementation of the third aspect, which may be in accordance with any of the preceding implementations of the third aspect, the interpolating method further comprises a additional operation, in turn comprising: charging or discharging an additional capacitor substantially similar to the capacitor charged in the interpolating operation, to or from the supply voltage through a plurality of additional resistors in parallel substantially similar to the plurality of the resistors in parallel used in the interpolating operation, as initiated by one of the first and the second input clock edges, by charging or discharging the additional capacitor through the entire plurality of the additional resistors; and determining an output signal of the additional operation on the basis of the voltage over the additional capacitor after it has passed voltage over the capacitor used in the interpolating operation at the second input clock edge. The method further comprises supplying the output signals of the interpolating operation and the additional operation as input clocks to a further interpolating operation, wherein the output clock is determined on the basis of the output signals of the interpolating operation and the additional operation.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

DETAILED DESCRIPTION

The detailed description provided below in connection with the appended drawings is intended as a description of the embodiments and is not intended to represent the only forms in which the embodiment may be constructed or utilized. However, the same or equivalent functions and structures may be accomplished by different embodiments.

Figure 1:
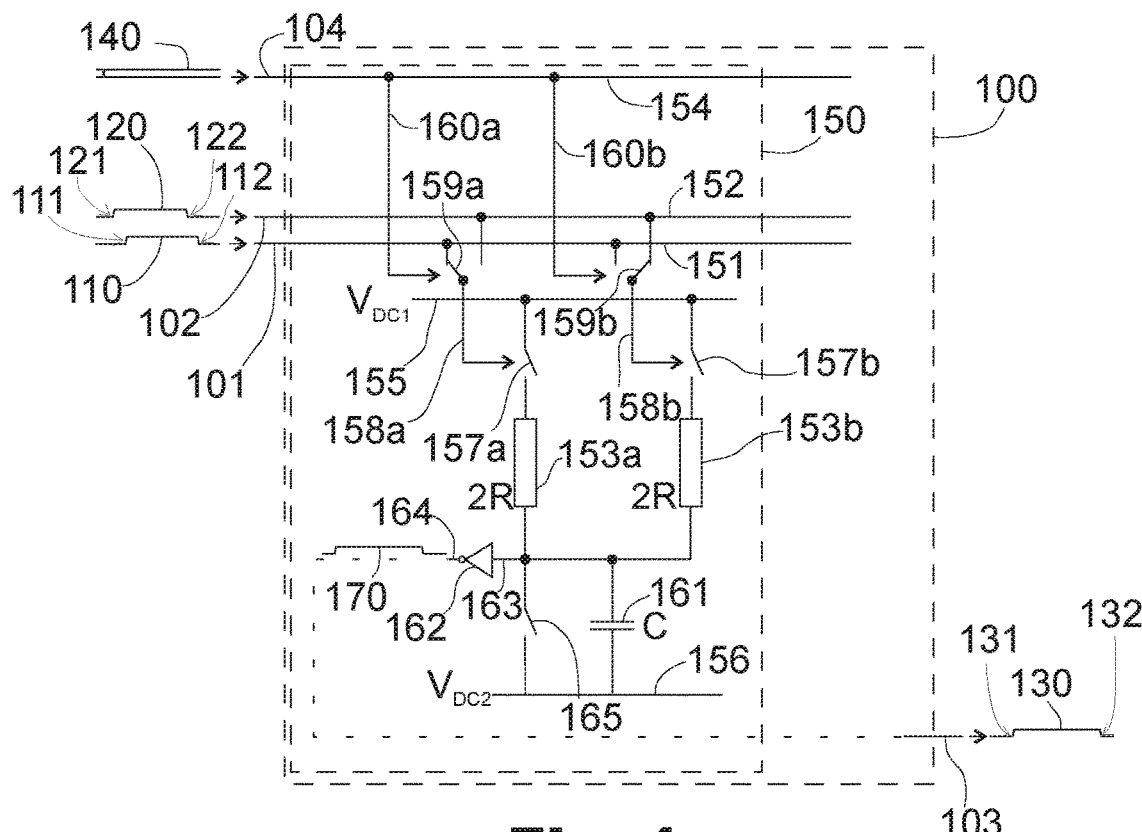
FIG. 1 illustrates a circuit diagram of an interpolating circuit unit incorporated in a phase interpolator.
Figure 4:
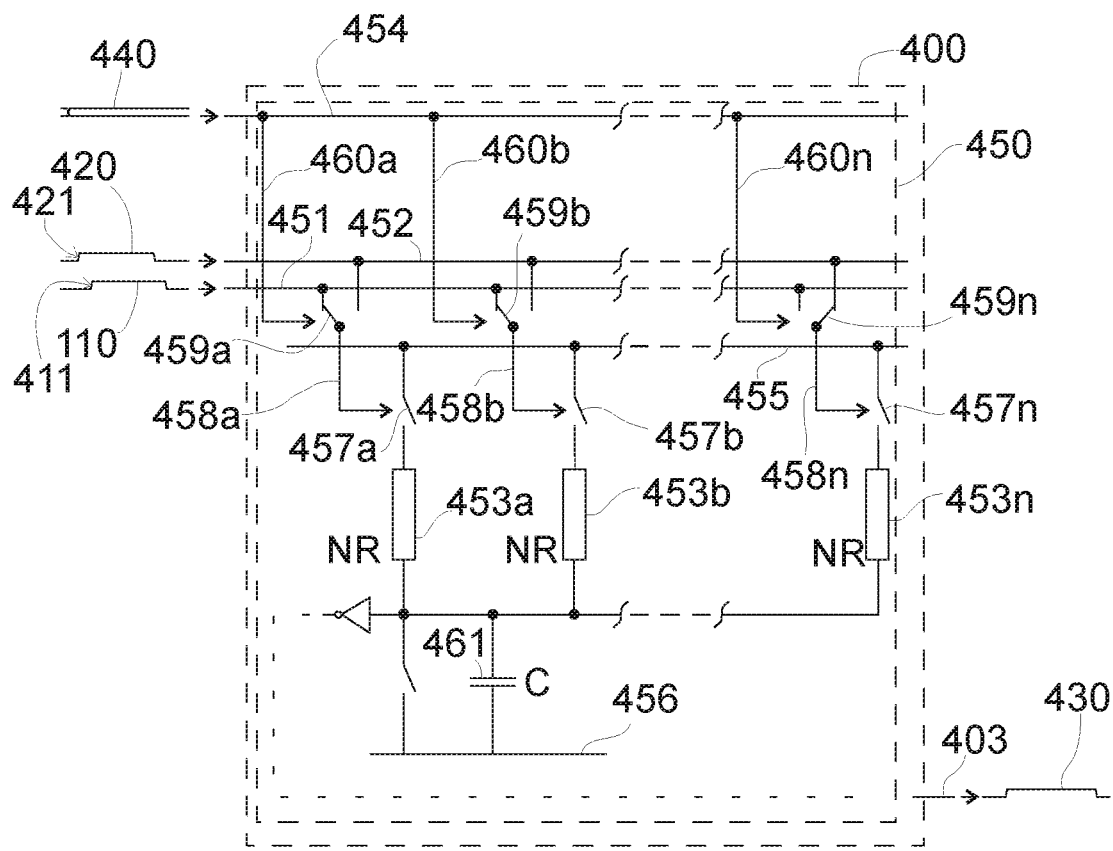
FIG. 4 illustrates a circuit diagram of another interpolating circuit unit incorporated in a phase interpolator.
Figure 6:
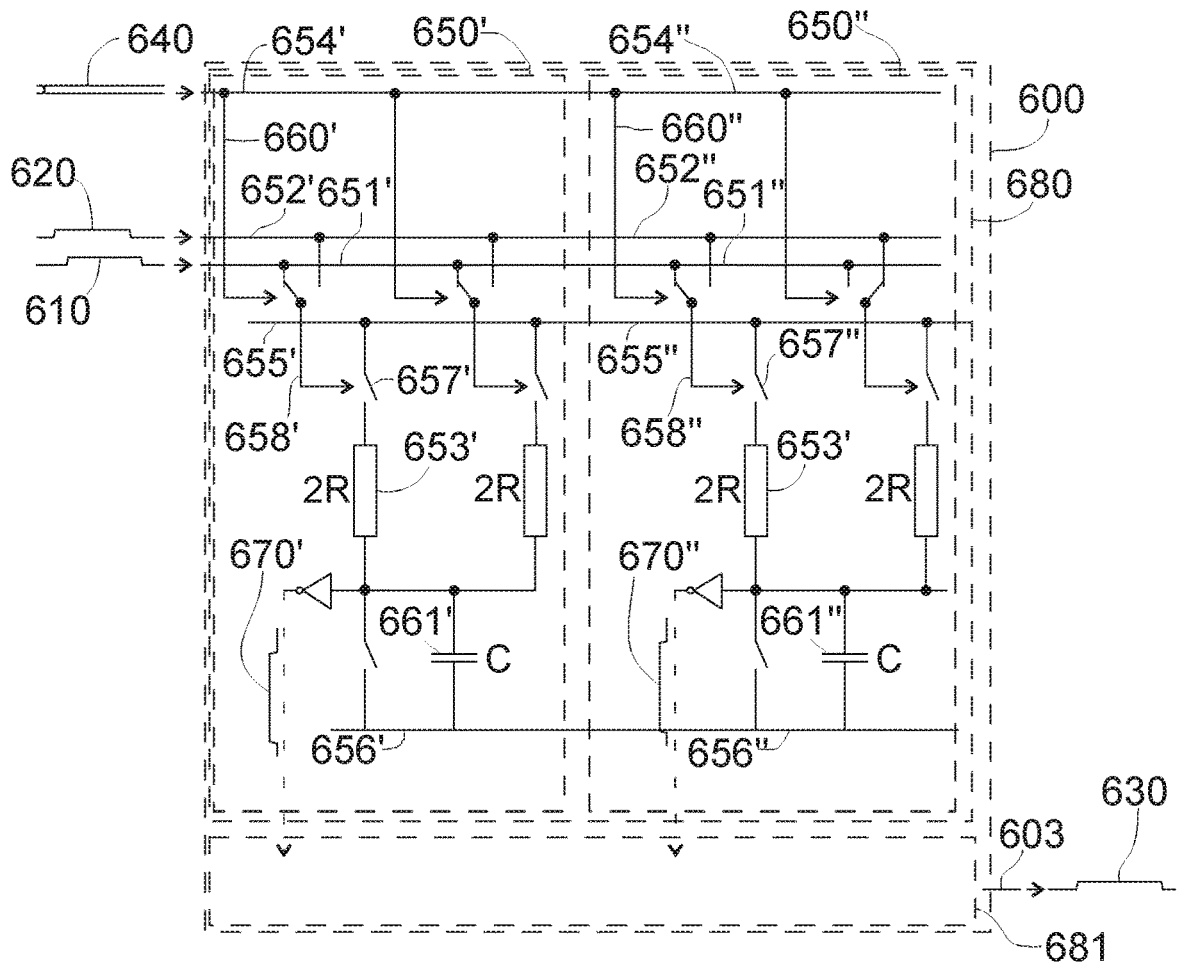
FIG. 6 illustrates a circuit diagram of two interpolating circuit units incorporated in a phase interpolator.

The phase interpolator 100 of FIG. 1, as well as the phase interpolators 400, 600 of FIGS. 4 and 6, may be implemented in accordance with any appropriate IC (Integrated Circuit) technology, such as CMOS (Complementary Metal-Oxide-Semiconductor). They may be implemented as a specific phase interpolator chip, or incorporated in a larger circuitry contained within a single chip.

The phase interpolator has a first clock input terminal 101, a second clock input terminal 102, and a clock output terminal 103. "Terminal" refers to an interface of the phase interpolator. In the case of a specific phase interpolator chip, it may also refer to a physical connector or terminal of such chip. In the case of the phase interpolator being incorporated as a part of a larger circuitry, "terminal" may refer just to a location of interface between the phase interpolator and the rest of such circuitry.

The phase interpolator 100 is configured to receive, at the first clock input terminal 101, a first input clock 110 having a first input clock rising edge 111 with a first phase, and to receive, at the second clock input terminal 102, a second input clock 120 having a second input clock rising edge 121 with a second phase delayed from the first phase; and produce, at the clock output terminal, an output clock 130 having an output clock rising edge 131 with an output phase between the first and the second phases.

"A clock" refers to a clock signal, having one or more specific features, such as an edge, with a specific phase or time, suitable for serving for various timing purposes.

An "edge" refers to a rising or falling edge of a clock, i.e. a clock signal. In the example of FIG. 1, the first input clock 110 and the second input clock 120 comprise step signals changing, at the first input clock rising edge 111 and the second input clock rising edge 121, from a "0" logic voltage level to an "1" logic voltage level, and returning, at first input clock rising edge 112 and second input clock falling edge 122, back to the "0" logic voltage level. Correspondingly, the output clock 130 has an output clock rising edge 131 and an output clock falling edge 132.

The first input clock rising/falling edges 111,112, the second input clock rising/falling edges 121, 122, and the output clock rising/falling edges 131, 132 thus refer to a rising/falling edge 111, 112 of the first input clock 110, a rising/falling edge 121, 122 of the second input clock 120, and a rising/falling edge 131, 132 of the output clock 130.

There may be any appropriate potential difference between different logic voltage levels. Such potential difference may lie, for example, in the range of a resulting voltage of 0.5 to 5 V.

A step signal of a clock may have any appropriate length, i.e. time difference or delay between a rising edge and a falling edge of the clock. Such length may lie, for example, in the range of 50 to 500 ps.

In the example of FIG. 1, the phase interpolator 100 also has a control input terminal 104, and the phase interpolator is configured to receive a control signal 140 at the control input terminal 104.

The phase interpolator 100 comprises an interpolating circuit unit 150 serving as a basic building block of the phase interpolator 100.

The interpolating circuit unit 150 of FIG. 1 comprises a first clock line 151 connected to the first clock input terminal 101 to receive and carry the first input clock 110 received at the first clock input terminal 101, and a second clock line 152 connected to the second clock input terminal 102 of the phase interpolator to receive and carry the second input clock 120 received at the second clock input terminal 102.

The interpolating circuit unit 150 further comprises a control line 154 connected to the control input terminal 104 to receive and carry the control signal 140 received at the control input terminal 104.

The interpolating circuit unit 150 also comprises a first supply line 155 to which a first DC potential $V_{DC1}$ is connectable, and a second supply line 156 to which a second DC potential $V_{DC2}$ differing from the first DC potential is connectable. For example, the second DC potential may be a ground potential, and the first DC potential may be a positive potential level resulting in a positive supply voltage for the interpolating circuit 150.

The interpolating circuit unit 150 of FIG. 1 further comprises two resistors, namely, a first resistor 153a and a second resistor 153b, each with a resistance of 2 R, connected in parallel.

For each resistor 153a, 153b, the interpolating circuit unit 150 comprises a connecting switch, namely, a first connecting switch 157a and a second connecting switch 157b, which is configured to connect and disconnect the associated resistor 153a, 153b to and from the first supply line 155, respectively.

For each connecting switch 157a, 157b, the interpolating circuit unit 150 comprises a control link, namely, a first control link 158a and a second control link 158b. Each control link 158a, 158b is connected to the associated connecting switch 157a, 157b and to a selection switch, namely, a first selection switch 159a or a second selection switch 159b. Each selection switch 159a, 159b, in turn, is configured to connect the associated control link 158a, 158b to the first clock line 151 or the second clock line 152.

Thereby, each connecting switch 157a, 157b may be operated in accordance with the first input clock 110 or the second input clock 120, respectively, in dependence on the state of the corresponding selection switch 159a, 159b.

A switch being "operated in accordance with" a clock refers to the switch being configured to change its position in response to an edge or another appropriate characteristic feature of the clock signal.

Each selection switch 159a, 159b, in turn, is connected via a control line branch, namely, a first control line branch 160a or a second control line branch 160b, to the control line 154, to be operated in accordance with the control signal 140.

Hereinafter, reference numbers "153", "157", "158", "159", and "160" without the letter "a" or "b" are used to refer, respectively, to the resistors 153a, 153b, connecting switches 157a, 157b, control links 158a, 158b, selection switches 159a, 159b, and control line branches 160a, 160b in general, without distinguishing between individual elements referred to by "a" and "b".

The connecting switches 157 being "operated in accordance with" one of the first input clock 110 and the second input clock 120 at a time refers to the clock signal at issue, actually an edge 111, 112, 121, 122 thereof, initiating switching the connecting switch 157 from a closed position to an open position, or vice versa.

The control signal 140 may be arranged in accordance with any appropriate control signal form and type. It may determine, for each time, for each selection switch 159, the position of that selection switch, i.e. whether the selection switch 159 is to be connected to the first clock line 151 or to the second clock line 152.

In the situation illustrated in FIG. 1, the first selection switch 159a is connected to the first clock line 151 and the second connecting switch 159b is connected to the second clock line 152. Thereby, the first connecting switch 157a associated to the first selection switch 159a is operated in accordance with the first input clock 110, and the second connecting switch 157b associated to the second selection switch 159b is operated in accordance with the second input clock 120.

The interpolating circuit unit 150 further comprises a capacitor 161 with capacitance C, connected in series with the two resistors 153.

The capacitor 161, the resistors 153, and the connecting switches 157 are thereby arranged between the first supply line 155 and the second supply line 156.

The interpolating circuit unit 150 of FIG. 1 further comprises an inverter 162 with an input 163 connected between the resistors 153 and the capacitor 161 to receive the voltage over the capacitor 161, and an output 164 producing output signal 170 of the interpolating circuit unit 150. The inverter 162 is configured to produce at its output 164 one of two possible logic voltage levels which may be considered representing a low or "0" state and a high or "1" state, the state being changed in response to the voltage at the input 163 passing a threshold voltage level.

The interpolating circuit 150 of FIG. 1 comprises also a reset switch 165 configured, when closed, to short circuit the capacitor 161. The reset switch 165 allows resetting the capacitor 161, i.e. setting the voltage over it to zero before initiating an interpolating operation. The reset switch 165 may be operated, for example, in accordance with a reset signal (not illustrated in FIG. 1).

In the following, the operation of the phase interpolator 100 of FIG. 1, and the interpolating circuit unit 150 thereof is discussed.

Starting with a situation with zero voltage over the capacitor 161 and both of the connecting switches 157 being open, closing one or both of the connecting switches 157 initiates charging the capacitor 161 to voltage $V_{DC1}$-$V_{DC2}$. The time constant of the charging is RC or 2 RC, depending on the way of controlling the connecting switches 157. If both of the two connecting switches 157 are controlled to be connected to the first clock line 151 or to the second clock line 152, and thus to be operated in accordance with the first input clock 110 or the second input clock 120, respectively, the time constant is RC because the effective resistance of the two equally sized resistors 153 in parallel is halved. Instead, if the two connecting switches 157 are controlled to be connected to different clock lines 151, 152, and thus to be operated in accordance with different input clocks 110, 120, the time constant during the phase difference between the rising edges 111, 121 of the first input clock 110 and the second input clock 120 is 2 RC. These two different situations are illustrated in FIG. 2.

Figure 2:
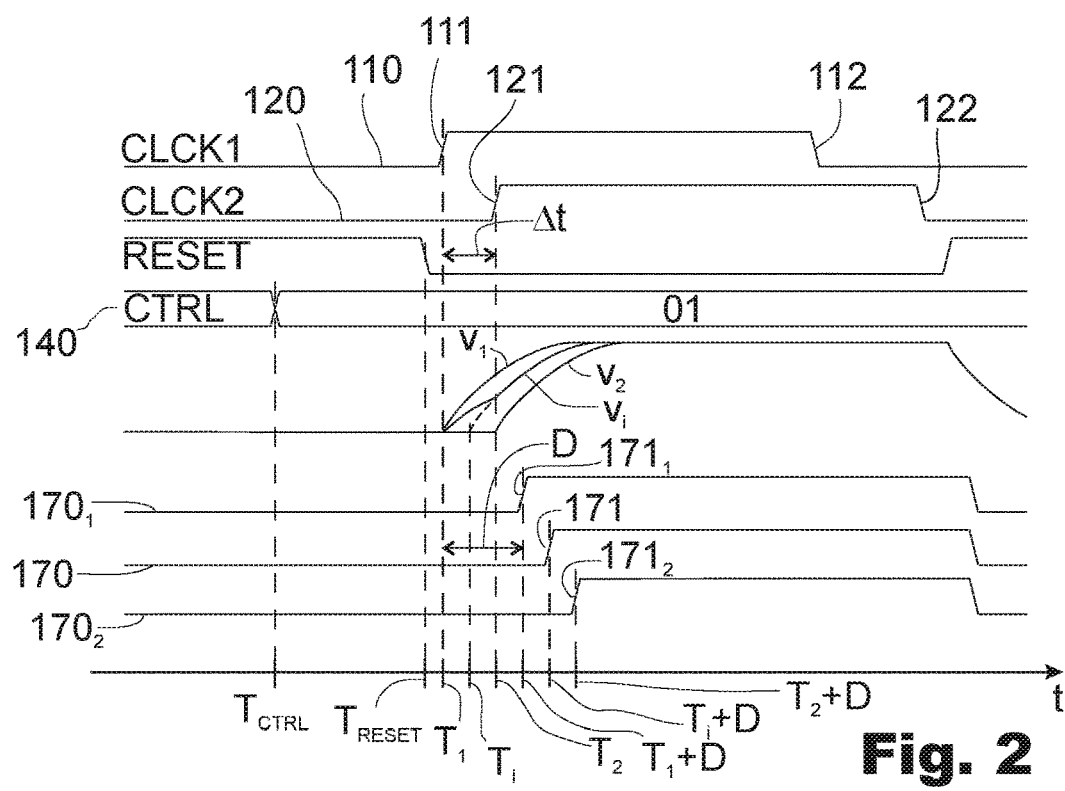
FIG. 2 illustrates time diagram of the phase interpolator and interpolating circuit unit of FIG. 1.

FIG. 2 shows time diagrams of the different signals and voltages supplied to and developed in the phase interpolator 100 and the interpolating circuit unit 150.

The first input clock CLCK1 110 comprises a step signal having a rising edge 111 with a first phase of The second input clock CLCK2 120 comprises a corresponding step signal having a rising edge 121 with second phase $T_2$, delayed from the first phase $T_1$ by a phase or time difference $\Delta t$.

A feature of a signal "having a phase T" may be alternatively considered as that feature occurring at time T.

A reset signal RESET determines the reset switch 165, having initially been closed, to be opened at resetting time $T_{RESET}$ preceding the rising edge 111 of the first clock 120.

The control signal CTRL 140 determines, as of control time $T_{CTRL}$ preceding the resetting time in the example of FIG. 2, the first connecting switch 157a to be connected to the first clock line 101 and the second connecting switch 157b to be connected to the second clock line 102. In other embodiments, control time may be timed after the resetting time, but preceding the first phase $T_1$ of the rising edge of the first input clock.

Three different behaviors of the voltage over the capacitor 161 are also shown in FIG. 2. Voltage $v_1$ represents a first fictitious situation, i.e. a situation not illustrated in FIG. 1, with both of the connecting switches 157 being operated in accordance with the first input clock 110. Voltage $V_2$ represents a second fictitious situation with both of the connecting switches 157 operated in accordance with the second input clock 120. Voltage $v_i$ represents the actual voltage over the capacitor 161 in the situation illustrated in FIG. 1, with the first connecting switch 157a being operated in accordance the first input clock 110 and the second connecting switch 157b being operated in accordance with the second input clock 120.

Figure 3:
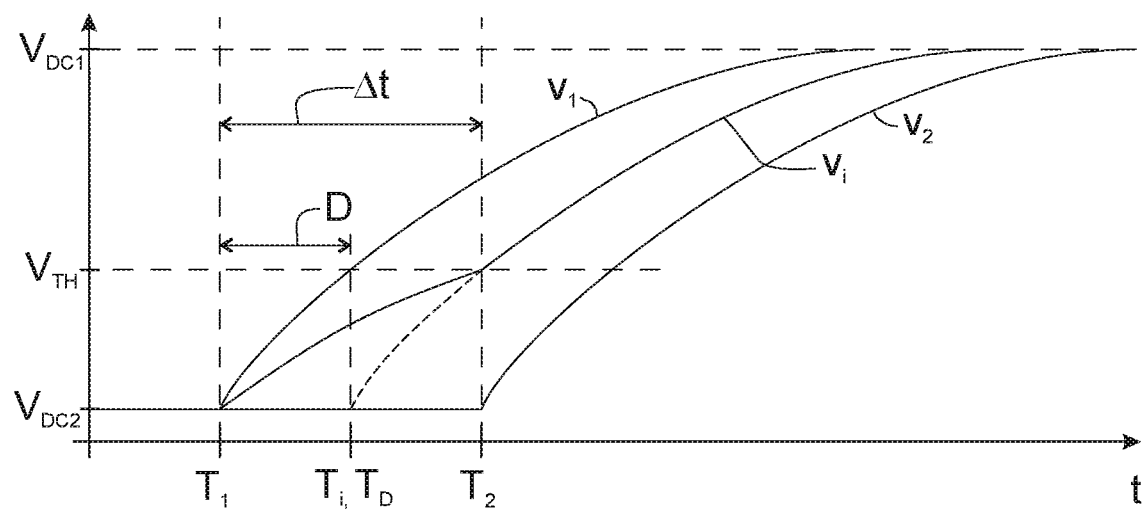
FIG. 3 shows a voltage graphs illustrating the operation of the interpolating circuit unit of FIG. 1.

As illustrated more closely in FIG. 3, the first fictitious voltage $v_1$ over the capacitor 161 develops, starting at time $T_1$, towards the voltage $V_{DC1}$-$V_{DC2}$ with time constant RC. The second fictitious voltage $v_2$, in turn, develops towards the same voltage with the same time constant, but starting at time $T_2$.

Instead, the actual voltage $v_i$ over the capacitor 161 in the situation illustrated in FIG. 1 develops first, starting at time $T_1$, towards the voltage $V_{DC1}$-$V_{DC2}$ with time constant 2 RC, thus clearly slower than the fictitious voltages $v_1$ and $v_2$. Front time $T_2$ on, however, the actual voltage $v_i$ develops with time constant RC, following the same shape as the voltage curves of $v_1$ and $v_2$. Thus, from time $T_2$ on, the actual voltage develops similarly as if both of the connecting switches 157 had been connected to an effective clock signal having an effective or interpolated $$T_i = T_1 + \frac{\Delta t}{2},$$

rising edge with phase of the Interpolated rising edge thus lying at the middle of the phases or times $T_1$, $T_2$ of the rising edges 111, 121 of the first input clock 110 and the second input clock 120.

Said behavior of the actual voltage $v_i$ over the capacitor 161 may be utilized in the phase interpolator 100 to determine the output clock 130 having the output clock rising edge 131

$$\frac{\Delta t}{2}$$

phase interpolated, the interpolation being based on the phase difference between the effective clock signal and the first input clock 110 or the second input clock 120.

For this purpose, the inverter 162 of the interpolating circuit unit 150 is configured to have a threshold voltage $V_{TH}$, which in the example of FIG. 2 equals the level which the voltage $v_i$ over the capacitor 161 reaches by the time $T_2$, so that the inverter 162 changes its output from "0" to "1" when the voltage at its input 163 exceeds the threshold voltage $V_{TH}$. In other embodiments, such threshold voltage may lie above the level which the voltage $v_i$ over the capacitor 161 reaches by the time $T_2$.

Thereby, referring back to FIG. 2, the actual voltage $v_i$ over the capacitor 161 after the second input clock rising edge 121 defines the output signal 170 of the interpolating circuit unit 150. As discussed above, in practice, the output signal 170 is produced by the inverter 162 determining the output signal 170 of the interpolating circuit unit on the basis of the voltage $v_i$ over the capacitor 161 after the second input clock rising edge 121.

A voltage "defining" a signal refers to the signal having characteristic feature(s) depending on the characteristic feature(s) of that voltage.

Respectively, a component or module "determining" a signal "on the basis of" a voltage refers to that signal being determined so as to be affected by that voltage such that the characteristic feature(s) of the signal depend(s) on the characteristic feature(s) of the voltage.

In other embodiments, instead of an inverter, there may be other components and arrangements in an interpolating circuit unit for determining the output signal of the interpolating circuit unit on the basis of the voltage over the capacitor after the second input clock rising or falling edge.

The absolute phase, or the absolute time of the rising edge 171 of the output signal 170, defined in the same timeline as the first input clock 110 and the second input clock 120, does not equal the phase $T_i$ of the effective edge. Instead, there is an inherent delay in the output signal 170 of the interpolating circuit unit 150 also in the fictitious situations with both of the connecting switches 157 being operated in accordance with the first input clock 110 or the second input clock 120. This delay is illustrated in FIG. 3 as the phase or time difference D between the phase $T_1$ of the rising edge of the first input clock 110 and the delayed time $T_D$ at which the first fictitious voltage $v_1$ exceeds the threshold voltage $V_{TH}$. Said absolute phase or time thus equals $D+T_i$.

In the example of FIG. 3, with the threshold voltage $V_{TH}$ equaling the level which the voltage $v_i$ over the capacitor 161 reaches by the time $T_2$, said delayed time coincides with the phase or time $T_i$ of the effective edge.

As illustrated in FIG. 2, the rising edge 171 of the output signal 170 of the interpolating circuit unit 150 has its absolute phase of $T_i+D$ interpolated in the middle of the absolute phases $T_1+D$, $T_2+D$ of the rising edges $171_1$, $171_2$ of the fictitious output signals $170_1$, $170_2$ produced in the first fictitious situation and in the second fictitious situation, respectively.

Such output signal 170 having a rising edge 171 may be considered as a clock (signal). The absolute phase $T_i+D$ of the rising edge 171 thereof may be considered as a characteristic feature of the output signal 170, being defined by, and determined on the basis of, the phase difference between the actual voltage curve $v_i$ after the second input clock rising edge 121 and the corresponding part of the fictitious voltage curve $v_1$ or $v_2$.

Instead of the rising edges 111, 121 dealt above with reference to the example of FIGS. 1 to 3, in other embodiments, falling edges of input clocks may be used to generate an output clock with interpolated phase of the output clock falling edge. In yet other embodiments, it is possible to use both of the rising edges and the falling edges of input clocks to generate an output clock with both interpolated rising edge and interpolated falling edge.

Instead of the two resistors 153 of the example of FIG. 1, in other embodiments, an interpolating circuit unit may comprise any appropriate number N of resistors with resistance NR, connected in parallel. This is illustrated in FIG. 4.

Except for the number of the resistors, the interpolating circuit unit 450 of the phase interpolator 400 is basically in accordance with that of FIG. 1. For example, for each resistor, namely, a first resistor 453a, a second resistor, and further resistors up to a $n^{th}$ resistor 453n, the interpolating circuit unit 450 comprises a connecting switch. Thus, there are a first connecting switch 457a, a second connecting switch 457b, and further connecting switches up to a $n^{th}$ connecting switch 457n. Each connecting switch 457a, 457b, ..., 457n is configured to connect and disconnect the associated resistor 453a, 453b, ..., 453n to and from the first supply line 455, respectively.

Further, for each connecting switch 457a, 457b, ..., 457n, the interpolating circuit unit 450 comprises a control link, namely, a first control link 458a, a second control link 458b, and further control links up to a $n^{th}$ control link 458n.

Each control link 458a, 458b, ..., 458n is connected to the associated connecting switch 457a, 457b, 457n and to a selection switch, namely, a first selection switch 459a, a second selection switch 459b, or to a further selection switch up to a $n^{th}$ selection switch 459n. Each selection switch 459a, 459b, ..., 459n, in turn, is connected via a control line branch, namely, a first control line branch 460a, a second control line branch 460b, or a further control line branch up to a $n^{th}$ control line branch 460n, to the control line 454, to be operated in accordance with the control signal 440.

Each selection switch 459a, 459b, ..., 459n is configured to connect the associated control link 458a, 458b, ..., 458n to the first clock line 451 or the second clock line 452. Thereby, each connecting switch 457a, 457b, ..., 457n may be operated in accordance with the first input clock 410 or the second input clock 420, respectively.

Hereinafter, reference numbers "453", "457", "458", "459", and "460" without the letter "a", "b", or "k" are used to refer, respectively, to the resistors 453a, 453b, ..., 453n, connecting switches 457a, 457b, ..., 457n, control links 458a, 458b, ..., 458n, selection switches 459a, 459b, ..., 459n, and control line branches 460a, 460b, ..., 460n in general, without distinguishing between individual elements referred to by "a", "b", ..., and "k".

The interpolator 400 produces, at its output terminal 403, an output clock 430.

In the phase interpolators 100, 400 of FIGS. 1 and 4, the arrangements of the control links 158, 458, selection switches 159, 459, and the control line branches 160, 460 between the connecting switches 157, 457 and the first clock line 151, 451 and the second clock line 151, 452 and the control line 154, 454 allow controlling, in accordance by the control signal 140, 440, a partial group of the connecting switches 157a, 457a, 457b to be operated in accordance with the first input clock 110, 410, and controlling the rest of the connecting switches 157b, 457n to be operated in accordance with the second input clock 120, 420. Those arrangements thus constitute example means for controlling the connecting switches 157, 457 that way.

In other embodiments, other arrangements may be implemented to allow such control of the connecting switches.

When the connecting switches 157, 457 are controlled as described above, the voltage over the capacitor 161, 461 develops, after the second input clock rising edge 121, 421 similarly as if each of the connecting switches 157, 457 was to be operated in accordance with an effective input clock having an effective edge between the first input clock rising edge 111, 411 and the second input clock rising edge 121, 421. Such fictitious effective edge is determined in accordance with the number k of connecting switches 157, 457 in the partial group of the connecting switches according to the following equation:

$$T_i = T_1 + \frac{(N-k)}{N}\Delta t,$$

where N denotes the total number of the connecting switches 157, 457 of the interpolating circuit unit 150, 450.

In the phase interpolators discussed above with reference to FIGS. 1 to 3, the number of resistors in the "plurality" of the resistors is two. Thus, with k=1, N=2, the phase of the effective edge is:

$$T_i = T_1 + \frac{1}{2}\Delta t,$$

i.e. the interpolating circuit unit halves the original phase difference between the input clocks.

Figure 5:
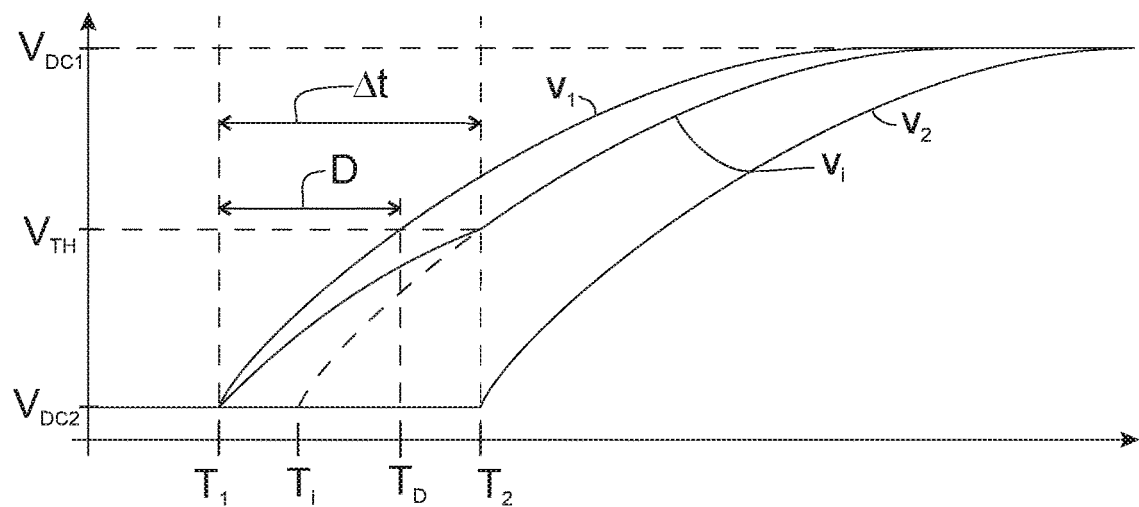
FIG. 5 shows a voltage graphs illustrating the operation of the interpolating circuit unit of FIG. 4.

In phase interpolators discussed with reference to FIG. 4, there may be any appropriate number N of the resistors. The higher is the number of the resistors, the more there are different possibilities for the interpolated, i.e. the effective edge. Thereby, the higher is the number N of the resistors, the higher is the interpolating resolution of the interpolating circuit unit. An example is illustrated in FIG. 5 showing voltages $v_1$, $v_2$, and $v_3$ in a situation differing from that of FIGS. 1 to 3 in that the number N of the resistors in the interpolating circuit unit is 10, and the number k of connecting switches in the partial group of the connecting switches is 7. The phase of the effective edge then is $$T_i = T_1 + \frac{3}{10}\Delta t.$$

In general, if the threshold voltage equals the level which the voltage $v_i$ over the capacitor reaches by the time $T_2$, the delay D follows the equation $$D = \frac{k}{N}\Delta t.$$

Thus, in the example, the delayed time $T_D$ is $$T_D = T_1 + \frac{7}{10}\Delta t.$$

In the examples of FIG. 1 and FIG. 4, one interpolating circuit unit 150, 450 is illustrated as being included in the phase interpolator 100, 400. With one interpolating circuit unit in a phase interpolator, the output clock may be directly formed by the output signal of the interpolating circuit unit. Thus, the output signal as such may be also the output clock of the entire phase interpolator. The output clock being "directly formed" by the output signal of the interpolating circuit unit includes that the output signal of the interpolating circuit unit may be processed, e.g. by filtering in any appropriate manner, to form the final output clock of the phase interpolator.

In other embodiments, a phase interpolator may have a plurality of interpolating circuit units. For example, two interpolating circuit units may be connected together to form a phase interpolating stage of an interpolator, the phase interpolating stage being connectable to a further phase interpolating stage to supply the output signals of the two interpolating circuit units as input clocks to the further phase interpolating stage. Thereby, a plurality of phase interpolating stages may be connected together, thereby providing an increased interpolation resolution of the phase interpolator in comparison to a single-stage embodiment. One example of a two-unit phase interpolating stage is illustrated in FIG. 6.

The phase interpolating stage 680 of the phase interpolator 600 FIG. 6 comprises two interpolating circuit units, namely, a first interpolating circuit unit 650' and a second interpolating circuit unit 650", which may be basically in accordance with the interpolating circuit unit 150 of FIG. 1. Each interpolating circuit unit 650', 650" thus comprises two resistors 653', 653". For each resistor, there is a connecting switch 657', 657" which is configured to connect and disconnect the associated resistor to and from the first supply line 655', 655", respectively. In other embodiments, phase interpolating stages with two interpolating circuit units may be implemented where the interpolating circuit units are in accordance with the interpolating circuit unit 450 of FIG. 4.

Further, for each connecting switch 657', 657", each interpolating circuit unit 650', 650" comprises a control link 658', 658" connected to the associated connecting switch 657', 657" and to a selection switch 659', 659". Each selection switch 659', 659", in turn, is connected via a control line branch 660', 660" to the control line 654, to be operated in accordance with the control signal 640.

Each selection switch is configured to connect the associated control link 658', 658" to the first clock line 651', 651" or the second clock line 652', 652". Thereby, each connecting switch 657', 657" may be operated in accordance with the first input clock 610 or the second input clock 620, respectively.

Differently from FIGS. 1 and 4, for the sake of clarity, in FIG. 6, the "first" and the "second" elements of each interpolating circuit unit 650', 650" are not marked separately in FIG. 6, using letters "a" and "b" attached to the reference numbers.

In the example of FIG. 6, the first interpolating circuit unit 650' and the second interpolating circuit unit 650" have their first clock lines 651', 651", second clock lines 652' 652", control lines 654', 654", first supply lines 655', 655", and second supply lines 656', 656" combined. Thus, for example, there are no separate first clock lines in the first interpolating circuit unit 650' and in the second interpolating circuit unit 650", but one single signal line forming the first clock line 651' of the first interpolating circuit unit 650' and the first clock line 651" of the second interpolating circuit unit 650". In other embodiments, corresponding lines of different interpolating circuit units of an interpolator may be formed as two physically separate signal lines.

In the phase interpolator 600 of FIG. 6, the arrangement of the control links 658', 658", selection switches 659', 659", and the control line branches 660', 660" between the connecting switches 657' 657" and the first clock line 651', 651" and the second clock line 652', 652" and the control line 654', 654" allows controlling, in the first interpolating circuit 650', the connecting switches 657' similarly to the interpolators discussed above with reference to FIGS. 1 and 4. Thus, in the first interpolating circuit unit 650', a partial group of the connecting switches 657' may be controlled, in accordance with the control signal 640, to be operated in accordance with the first input clock 610. The rest of the connecting switches 657', in turn, may be controlled, in accordance by the control signal 640, to be operated in accordance with the second input clock 620.

In the second interpolating circuit unit 650", said arrangement allows controlling all the connecting switches 657", in accordance with the control signal 640, to be operated in accordance with the first input clock 610 or in accordance with the second input clock 620.

When controlled that way, the first interpolating circuit unit 650' produces an output signal 670' which is similar to the interpolated output signal 170 discussed above with reference to FIGS. 1 to 3. The second interpolating circuit unit 650", instead, then produces an output signal 670" which is similar to the first fictitious output signal $170_1$ or the second fictitious output signal $170_2$ discussed above with reference to FIGS. 1 to 3. Those two output signals 670', 670" of the two interpolating circuit units 650', 650", as such or as processed in any appropriate manner, may then serve as two input clocks supplied to a further interpolating stage 681 to which the interpolating stage 680 is connected. The interpolator 600 produces, at its output terminal 603, an output clock 630.

In other embodiments, instead of interpolating circuit units with two resistors, interpolating units in accordance with those discussed above with reference to FIGS. 4 and 5 may be used.

In the examples of FIGS. 1, 4, and 6, the interpolating operation is basically based on charging the capacitor 161, 461, 661', 661" of the interpolating circuit unit 150, 450, 650', 650", as controlled by controlling the connecting switches 157, 457, 657', 657", to a supply voltage. In other embodiments, inverted arrangements may be used where interpolating operation may be based on discharging a capacitor of an interpolating circuit unit, as controlled by controlling switches, from a supply voltage.

The principle of charging or discharging a capacitor through resistors may allow producing interpolating circuit units and phase interpolators comprising the same, operating with high linearity and low noise. This may be contributed by the fact that as capacitors, also resistors may be produced with high accuracy in integrated circuit technologies. Thereby, good match may be achieved between them, enabling having highly identical interpolating circuit units and stages of phase interpolators.

Figure 7:
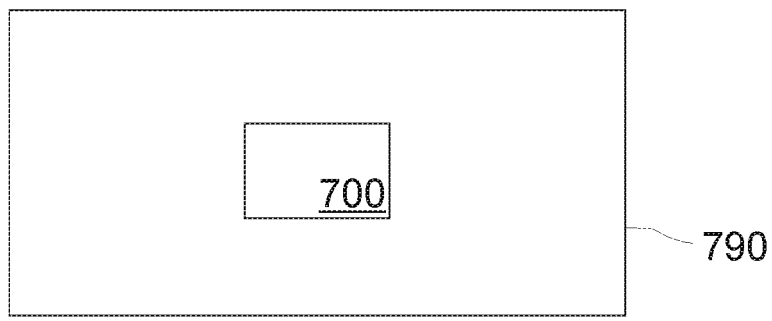
FIG. 7 illustrates schematically a phase-locked loop.

Any of the phase interpolators discussed above may be incorporated in a phase-locked loop, an example of such being schematically illustrated in FIG. 7. In addition to the phase interpolator 700, the phase-locked loop 790 may include any appropriate other modules, elements, and components (not illustrated in FIG. 7).

The phase-locked loop 790 may be, for example, an analog phase-locked loop, a digital phase-locked loop, or a sub-sampling phase-locked loop.

The operations which the phase interpolators and interpolating circuit units discussed above are configured to carry out constitute operations of example phase interpolating methods, which may be automatically carried out also by other appropriate types of interpolators and interpolating circuit units. Further, the phase interpolating methods discussed below may be carried out, for example, by the phase interpolators and interpolating circuit units which are in accordance with those discussed above.

The definitions and advantages discussed above with reference to any phase interpolator or interpolating circuit unit apply, mutatis mutandis, also to the methods discussed below. The same applies vice versa.

Figure 8:
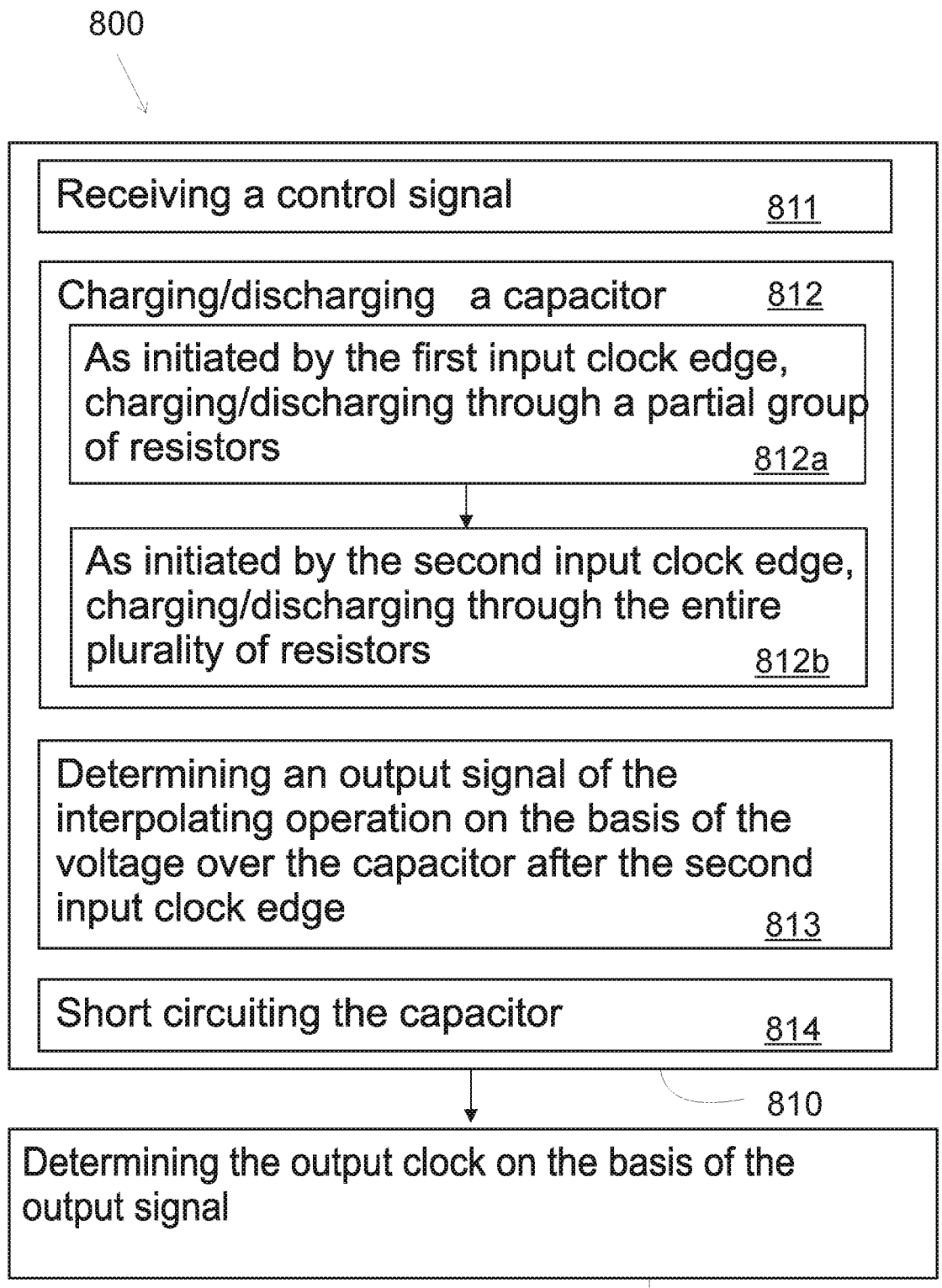
FIGS. 8 and 9 illustrate interpolating methods.

The phase interpolating method 800 of FIG. 8 may generally comprise receiving a first input clock having a first input clock edge with a first phase, and a second input clock having a second input clock edge with a second phase delayed from the first phase; and producing an output clock having an output clock edge with an output phase between the first phase and the second phase.

The method 800 of FIG. 8 comprises an interpolating operation 810 comprising, in step 811, receiving a control signal.

In step 812, the interpolating operation comprises charging or discharging a capacitor to or from a supply voltage through a plurality of resistors in parallel. The charging or discharging starts, in sub-step 812a, as initiated by the first input clock edge, by charging or discharging the capacitor through a partial group of resistors of the plurality of the resistors, the partial group being determined in accordance with the received control signal. In sub-step 812b, as initiated by the second input clock edge, said charging or discharging continues by charging or discharging the capacitor through the entire plurality of the resistors.

An action, operation, or step being "initiated by" a clock edge refers to starting that action, operation, or step at the time of that clock edge.

Then, the voltage over the capacitor after the second input clock edge develops as if the capacitor was charged or discharged, as initiated by an effective edge determined between the first input clock edge and the second input clock edge in accordance with the number of resistors in the partial group of the resistors. This development may thus be in accordance with the actual voltage $v_i$ curve illustrated in FIG. 3.

In step 813, the interpolating operation comprises determining an output signal of the interpolating operation on the basis of the voltage over the capacitor after the second input clock edge.

The interpolating operation further comprises, in step 814, short circuiting the capacitor, thereby resetting the voltage over it to allow initiation of a new interpolating operation. Correspondingly, the capacitor may also be short circuited to reset its voltage before starting the interpolating operation 810.

In operation 830 of the method 800, the output clock is determined on the basis of the output signal of the interpolating operation.

The step 813 of the interpolating operation, and the operation 830 where the output clock is determined, may be carried out, for example, as discussed above with reference to FIGS. 1 to 6. Thus, for example, the output signal of the interpolating operation may be determined to be a clock signal with an interpolated phase timed at the instant of time at which the voltage over the capacitor exceeds/surpasses a threshold voltage set at the level which the voltage over the capacitor reaches by the second input clock edge. On the other hand, the output clock may be determined, in the simplest case, directly so as to be formed by the output signal of the interpolating operation, possibly after some appropriate signal processing.

Figure 9:
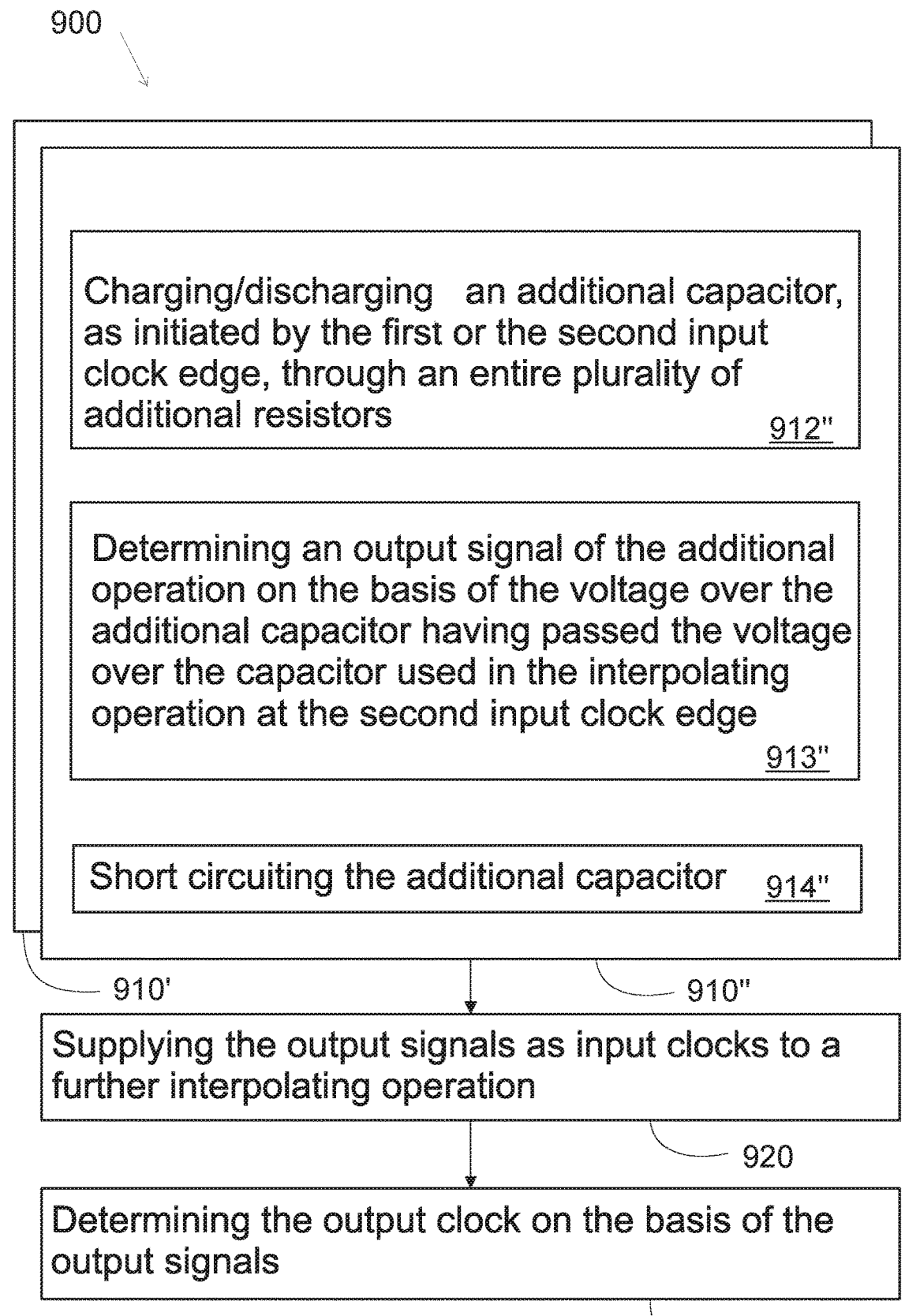

The method 900 of FIG. 9 differs from that of FIG. 8 in that in addition to the interpolating operation 910' in accordance with the interpolating operation 810 discussed above with reference to FIG. 8, it also comprises additional operation 910", comprising steps corresponding to the steps of the interpolating operation 910'.

The additional operation 910" and the steps thereof may be carried out simultaneously with the interpolating operation 910'. Alternatively, the additional operation 910" or at least one or more steps thereof may be carried out non-simultaneously with the interpolating operation 910' or the corresponding steps(s) thereof.

The additional operation may comprise a step of receiving a control signal (not illustrated).

In step 912", the additional operation comprises charging or discharging an additional capacitor to or from a supply voltage through a plurality of additional resistors in parallel. The additional capacitors and the additional resistors are substantially similar to the resistors and the capacitors used in the interpolating operation 910'.

Being "substantially similar" refers to the characteristics and performance of the resistors and the additional resistors, and those of the capacitors and the additional capacitors, close to each other or even identical, within the manufacturing tolerances. Said similarity in the characteristics and performance may refer, for example, to the capacitance and resistance values of the components.

The charging or discharging the additional capacitor is carried out as initiated by the first or the second input clock edge. Differently from the interpolating operation 910', the additional capacitor is charged or discharged in the additional operation 910" through the entire plurality of the resistors.

Then, the voltage over the additional capacitor may develop in accordance with any of the "fictitious" voltage curves $v_1$, $v_2$ illustrated in FIG. 3.

In step 913", the additional operation 910" comprises determining an output signal of the additional operation on the basis of the voltage over the additional capacitor after it has passed, i.e. exceeded or surpassed, the voltage over the capacitor used in the interpolating operation at the second input clock edge. As discussed above with reference to FIG. 3, there may be a threshold voltage level set at or above the level which the voltage over the capacitor used in the interpolating operation 910' reaches by the second input clock edge. Then, the output signal of the additional operation may be determined so as to have an edge at the time when the voltage over the additional capacitor passes such threshold voltage level.

Similarly to the interpolating operation 910', the additional operation further comprises, in step 914", short circuiting the additional capacitor to allow initiation of a new additional operation. Correspondingly, the additional capacitor may also be short circuited to reset its voltage before starting the additional operation 910".

In operation 920 of the method 900, the output signals of the interpolating operation and the additional operation are supplied as input clocks to a further interpolating operation which may be carried out, for example, in accordance with the interpolating operation 910' or the additional operation 910" discussed above.

After one or more such further interpolating operations, the method 900 comprises, in operation 930, determining the output clock. The output clock is determined on the basis of both the output signal of the interpolating operation and the output signal of the additional operation. Thus, both of those output signals affect the final output clock.

All the above operations of the methods may be carried out automatically, e.g. by means of a phase interpolator and interpolating circuit unit in accordance with any of those discussed above.

"Automatically" refers to carrying out the operations at issue by means of appropriate equipment, according to specific rules and procedures which may be defined e.g. by components and connections of one or more electrical circuits, without need for any contribution provided or determination performed by a user of an apparatus or device incorporating such equipment.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

Although the present invention and its advantages have been described in detail, it should be understood that various changes, substitutions and alterations can be made herein without departing from the spirit and scope as defined by the appended claims.

The invention claimed is:

1. An apparatus comprising a first circuit, wherein the first circuit comprises, between a first and a second supply line for receiving a first and a second direct current (DC) potential, respectively, the first and the second DC potentials differing from each other:
   a plurality of resistors in parallel;
   wherein one end of each of the resistors is coupled to a connecting switch respectively, each connecting switch is configured to connect and disconnect, in accordance with one of a first and a second input signals at a time, the respective resistor to and from the first supply line, respectively; and
   the other ends of the plurality of resistors are coupled to a capacitor in series;
   the first circuit further comprises:
   a first signal line and a second signal line configured to receive the first and the second input signals, respectively; and
   each connecting switch is selectively coupled to one of the first and the second signal lines, respectively.

2. The apparatus according to claim 1, wherein the first circuit further comprises an inverter having an inverter input connected between the resistors and the capacitor to receive a voltage over the capacitor, the inverter being configured to determine an output signal of the first circuit based on the voltage over the capacitor.

3. The apparatus according to claim 1, wherein the first circuit further comprises a reset switch that is configured, when closed, to short circuit the capacitor.

4. The apparatus according to claim 1, wherein the first circuit is a first interpolating circuit, the apparatus further comprises a second interpolating circuit, and the apparatus is configured to allow:
   in the first interpolating circuit, controlling a partial group of the connecting switches to be operated in accordance with the first input signal, and controlling the rest of the connecting switches to be operated in accordance with the second input signal, and in the second interpolating circuit, controlling all the connecting switches to be operated in accordance with one of the first and the second input signals;
   wherein the first and the second interpolating circuits form a phase interpolating stage connected to a further phase interpolating stage to supply output signals of the first and the second interpolating circuits as input signals to the further phase interpolating stage.

5. The apparatus according to in claim 1, wherein the apparatus is implemented as a Complementary Metal-Oxide-Semiconductor (CMOS) integrated circuit.

6. A phase-locked loop comprising a phase interpolator, wherein
   the phase interpolator comprises a first circuit, wherein the first circuit comprises, between a first and a second supply line for receiving a first and a second DC potential, respectively, the first and the second DC potentials differing from each other:
   a plurality of resistors in parallel;

wherein one end of each of the resistors is coupled to a connecting switch respectively, each connecting switch is configured to connect and disconnect, in accordance with one of a first and a second input signals at a time, the respective resistor to and from the first supply line, respectively; and the other ends of the plurality of resistors are coupled to a capacitor in series;

the first circuit further comprises:

a first signal line and a second signal line configured to receive the first and the second input signals, respectively; and each connecting switch is selectively coupled to one of the first and the second signal lines, respectively.

7. The phase-locked loop according to claim 6, wherein the phase-locked loop is an analog phase-locked loop.

8. The phase-locked loop according to claim 6, wherein the phase-locked loop is a digital phase-locked loop.

9. The phase-locked loop according to claim 6, wherein the phase-locked loop is a sub-sampling phase-locked loop.

10. A phase interpolating method, comprising:

receiving a first input clock having a first input clock edge with a first phase, and a second input clock having a second input clock edge with a second phase delayed from the first phase;

performing an interpolation operation, wherein the interpolation operation comprises charging or discharging a capacitor to or from a supply voltage through a plurality of resistors in parallel, by starting, as initiated by the first input clock edge, charging or discharging the capacitor through a partial group of resistors of the plurality of the resistors, followed, as initiated by the second input clock edge, by charging or discharging the capacitor through the plurality of the resistors; and producing, based on a voltage over the capacitor based on the second input clock edge, an output clock having an output clock edge with an output phase between the first and the second phases.

11. The phase interpolating method according to claim 10, further comprising receiving a control signal; and determining the partial group of the resistors based on the control signal.

12. The phase interpolating method according to claim 10, wherein the interpolation operation comprising:

determining an output signal of the interpolating operation, wherein the determining the output signal comprises generating an interpolated clock with an interpolated edge determined by the voltage over the capacitor after the second input clock edge passing a threshold level.

13. The phase interpolating method according to claim 10, wherein the interpolating operation further comprising short circuiting the capacitor to allow initiation of a new interpolating operation.

14. The phase interpolating method according to claim 10, further comprising:

an additional operation, wherein the additional operation comprises:

charging or discharging an additional capacitor substantially similar to the capacitor charged in the interpolating operation, to or from the supply voltage through a plurality of additional resistors in parallel substantially similar to the plurality of the resistors in parallel used in the interpolating operation, as initiated by one of the first and the second input clock edges, by charging or discharging the additional capacitor through the plurality of the additional resistors; and determining an output signal of the additional operation based on the voltage over the additional capacitor based on it having passed voltage over the capacitor used in the interpolating operation at the second input clock edge; and wherein the method further comprises supplying the output signals of the interpolating operation and the additional operation as input clocks to a further interpolating operation, wherein the output clock is determined based on the output signals of the interpolating operation and the additional operation.

* * * * *